(12) United States Patent
Kim

(10) Patent No.: US 7,446,420 B1
(45) Date of Patent: Nov. 4, 2008

(54) THROUGH SILICON VIA CHIP STACK PACKAGE CAPABLE OF FACILITATING CHIP SELECTION DURING DEVICE OPERATION

(75) Inventor: Jong Hoon Kim, Gyeonggi-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 11/777,357

(22) Filed: Jul. 13, 2007

(30) Foreign Application Priority Data

Jun. 20, 2007 (KR) .................. 10-2007-0060260

(51) Int. Cl.
*H01L 29/40* (2006.01)
(52) U.S. Cl. .................. 257/777; 257/723; 438/405
(58) Field of Classification Search .......... 257/777, 257/723; 438/405
See application file for complete search history.

(56) References Cited

U.S. PATENT DOCUMENTS 5,502,333 A * 3/1996 Bertin et al. .................. 257/685

6,624,506 B2 * 9/2003 Sasaki et al. .................. 257/686

FOREIGN PATENT DOCUMENTS

KR    1020030050665 A    6/2003
KR    1020050120280 A    12/2005

* cited by examiner

*Primary Examiner*—Roy K Potter
(74) *Attorney, Agent, or Firm*—Ladas & Parry LLP

(57) ABSTRACT

A through silicon via chip stack package includes a substrate; a plurality of chips stacked over the substrate and provided with chip selection pads, through silicon vias and rewirings connecting the chip selection pad and the through silicon via respectively, the through silicon via being connected to one another; and outside connection terminals attached to a lower surface of the substrate, wherein the rewirings in each of stacked chips are formed so as to have connection structures between the chip selection pads and the through silicon vias which are different from one another in each of the chips.

11 Claims, 5 Drawing Sheets

FIG.7

|  | Pad for chip selecting connection | | |
| --- | --- | --- | --- |
|  | First pad | Second pad | Third pad |
| Chip 1 | Vcc | Vcc | Vss |
| Chip 2 | Vcc | Vcc | Vcc |
| Chip 3 | Vcc | Vss | Vss |
| Chip 4 | Vcc | Vss | Vcc |
| Chip 5 | Vss | Vcc | Vss |
| Chip 6 | Vss | Vcc | Vcc |
| Chip 7 | Vss | Vss | Vss |
| Chip 8 | Vss | Vss | Vcc |

THROUGH SILICON VIA CHIP STACK PACKAGE CAPABLE OF FACILITATING CHIP SELECTION DURING DEVICE OPERATION

CROSS-REFERENCE TO RELATED APPLICATIONS

The present application claims priority to Korean patent application number 10-2007-0060260 filed on Jun. 20, 2007, which is incorporated herein by reference in its entirety.

BACKGROUND OF THE INVENTION

The present invention relates to a chip stack package, and more particularly to a through silicon via chip stack package which facilitates a chip selection.

Packaging technologies for a semiconductor integrated device have been continuously developed to satisfy the demands for mounting efficiency and miniaturization. As the miniaturization and high performance are required in the recent development trends of the electric/electronic appliance, various semiconductor stacking technologies have been developed.

The "stack" referred in a semiconductor industry is a technology in which at least two semiconductor chips or packages are stacked up in a vertical direction. When this stack technology is applied in the field of memory devices, it is possible to realize a packaged product having the memory capacity more than two times the memory capacity of an unpackaged chip, for example, and thus it is possible to increase the efficiency of the mounting area usage.

FIG. 1 is a cross-sectional view illustrating a conventional chip stack package. As shown, chips 110 are stacked on a substrate 120 by the medium of adhesives 130 and each chip 110 is electrically connected to the substrate 120 through a wire 140. An upper surface of the substrate 120 including the stacked chips 110 and the wires 140 is sealed with an encapsulant 150 such as epoxy molding compound (EMC), and a lower surface of the substrate 120 is attached with solder balls 160 as the mounting means to an external circuit.

In FIG. 1, reference numeral 112 denotes a pad, 122 denotes an electrode terminal, 124 denotes a ball land, and 126 denotes a circuit wiring.

However, the conventional chip stack package has several disadvantages in that the operational speed is considered relatively slow due to use of metal wires for signal connections to each chip; the size of the package could not be made more compact since additional area is required on the substrate for a wire bonding; and further the height of the package could not be lowered as the gap for the wire bonding is required on the bonding pads of each chip.

A chip stack package using a through silicon via (hereinafter, referred as TSV) has been proposed for overcoming the above described problems associated with the conventional chip stack packages.

FIG. 2 is a cross-sectional view illustrating a TSV chip stack package. As shown, in the TSV chip stack package 200, a TSV 270 is formed by forming a hole in each chip 210 and filling in the hole with a conductive layer and then an electrical connection between the chips 210 is made by the TSV 270.

In FIG. 2, the reference numeral 212 denotes a pad, 220 denotes a substrate, 222 denotes an electrode terminal, 224 denotes a ball land, 226 denotes a circuit wiring, and 260 denotes a solder ball.

The TSV chip stack package 200 would not require an additional area on the substrate to provide for the electrical connections of wire bonding and would not require presence of a gap between the chips to provide for the wire bonding between the chips and the substrate as shown in FIG. 1. Thus, the TSV chip stack package 200 when compared to the conventional package 100 shown in FIG. 1 is reduces in size and height, because the signal connection lengths between the substrate and chips are shorter, and thereby allowing it possible to increase the operational speed of the chips packaged therein.

In the case of stacking NAND flash memory chips using wire bonding to realize such a chip stack package as shown in FIG. 1, now referring to FIG. 3, a chip selection during the operation of the packaged device can be made possible by making the wire bondings of chips 310a, 310b to a chip selection pad differently from each other such that the electrode terminals 322a, 322b (i.e. Vcc terminal and Vss terminal) are wire bonded to the chips 310a, 310b as shown in FIG. 3.

However, in the case of a TSV chip stack package, selecting a specific chip during the operation of a device is impossible, because no wire bonding as that shown in FIG. 3 is made in a TSV chip stack package. Therefore, the TSV chip stack package requires a novel connection structure for a chip selection.

In addition, in the conventional chip stack package, the chip selection requires increased number of chip selection pads as the number of the stacked chips increases.

However, if the number of chip selection pads are increased, the chip size inevitably increases due to the increased number of pads to be provided in a unit chip, and this prevents optimal miniaturization of the package itself as well as the product utilizing the package.

BRIEF SUMMARY OF THE INVENTION

Embodiments of the present invention are directed to a TSV chip stack package, which facilitates a chip selection during a device is operated.

Also, embodiments of the present invention are directed to a TSV chip stack package, which is capable of accomplishing a large number of chip stack without an increase in a chip size.

In one embodiment, a TSV chip stack package may comprise a substrate; a plurality of chips stacked over the substrate and provided with chip selection pads, through silicon vias and rewirings connecting the chip selection pad and the through silicon via respectively, the through silicon via being connected to one another; and outside connection terminals attached to a lower surface of the substrate, wherein the rewirings in each of stacked chips are formed so as to have connection structures between the chip selection pads and the through silicon vias which are different from one another in each of the chips.

In the embodiment, four chips may be stacked.

The each of the stacked chips is provided with first and second chip selection pads, first to third through silicon vias and two rewirings for connecting the first and second chip selection pads and the first to third through silicon vias in different structures from one another.

The first through silicon via is disposed between the first and the second chip selection chips and the second and the third through silicon vias are disposed outside the first and the second chip selection chips respectively.

The first to third through silicon vias are applied with Vss or Vcc signal.

In the embodiment, eight chips may be stacked.

The each of the stacked chips is provided with first to third chip selection pads, first to fourth through silicon vias and three rewirings for connecting the first to third chip selection pads and the first to fourth through silicon vias in different structures from one another.

The first and second through silicon vias are disposed between the first and the second chip selection chips and the third and fourth through silicon vias are disposed between the second and the third chip selection chips.

The first to fourth through silicon vias are applied with Vss or Vcc signal.

The outside connection terminal is a solder ball

BRIEF DESCRIPTION OF THE DRAWINGS

FIG. 7 is a table illustrating chip selection in the through silicon via chip stack package in accordance with another embodiment of the present invention.

DESCRIPTION OF SPECIFIC EMBODIMENTS

A preferred embodiment of the present invention is directed to a chip stack package in which a TSV is formed in each of the chips having at least two chip selection pads and at least two rewirings for connecting the TSV and the chip selection pads. The chips are stacked using the TSV. At this time, the rewirings in each chip are formed so that the stacked chips have connection structures between the TSVs and the chip selection pads, which are different from each other.

By doing this, since the stacked chips have connection structures between the TSVs and the chip selection pads which are different from one another, it is possible to facilitate a chip selection even during the device is operated by making an applied signal to the TSV including the rewiring different in each of the chips.

Therefore, in an embodiment of the present invention, since there are an advantage that a chip selection is facilitated as well as advantages that a size and a height of a package are reduced and an operation speed is enhanced by employing a TSV chip stack package structure, it is possible to realize a high performance product. Also, in an embodiment of the present invention, because the chips are stacked with the connection structures between the TSV and the chip selection pads which are different from one another, it is not necessary to increase number of the chip selection pads and thus prevent an increase in a chip size due to an increase in number of the chip selection pads.

Hereinafter, a chip stack package in accordance with an embodiment of the present invention will be described with reference to accompanying drawings.

Figure 4:
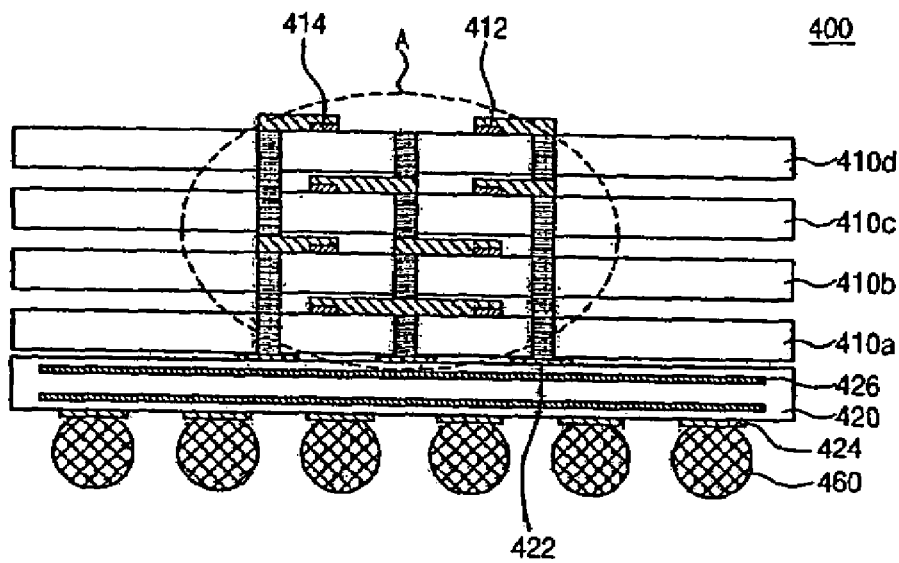
FIG. 4 is a cross-sectional view illustrating a through silicon via chip stack package in accordance with an embodiment of the present invention.
Figure 5:
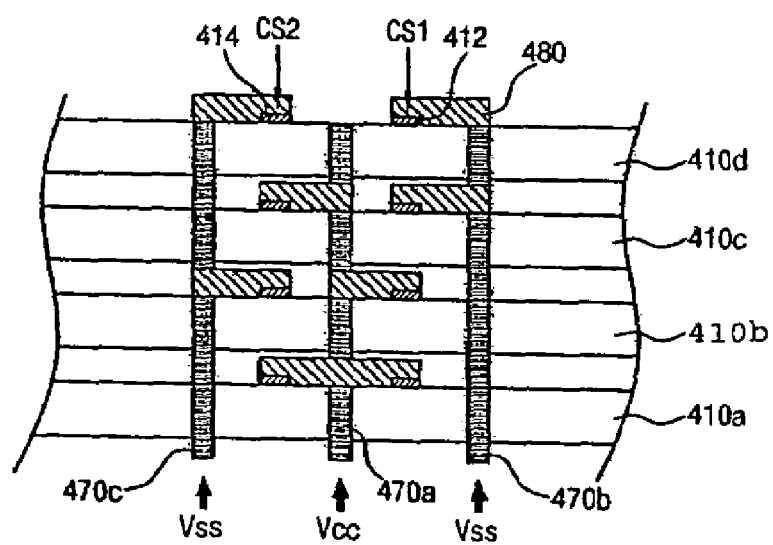
FIG. 5 is an enlarged view of a part A in FIG. 4 illustrating the chip selection in the through silicon via chip stack package in accordance with an embodiment of the present invention.

FIG. 4 is a cross-sectional view illustrating a TSV chip stack package in accordance with an embodiment of the present invention, and FIG. 5 is an enlarged view of a part A shown in FIG. 4 illustrating the chip selection of the TSV chip stack package in accordance with an embodiment of the present invention.

The TSV chip stack package 400 has four chips 410a to 410d that are stacked over a substrate 420, although the number of stackable chips is not limited to just four. TSVs 470a, 470b, and 470c that are provided to each of the chips 410a to 410d are arranged to be in contact with one another. Solder balls 460 are attached to the lower surface of the substrate 420 as an outside connection terminal.

Herein, the substrate 420 is provided with a circuit wiring 426 including the electrode terminals 422 disposed at the upper surface of the substrate 420 and ball lands 424 disposed at the lower surface of the substrate 420.

The chips are stackable by a $2^n$ (where n is an integer greater than 2 such as 4, 8, 16, 32, etc.) number of chips, and thus four chips 410a to 410d are stacked in an embodiment as shown in FIGS. 4-5. In addition, each of the stacked chips 410a to 410d is provided with a first chip selection pad (CS1) 412 and a second chip selection pad (CS2) 414.

Among the TSVs 470a, 470b, and 470c, a first TSV 470a is disposed between the first chip selection pad 412 and the second chip selection pad 414 in each of the chips 410a to 410d, and a second TSV 470b and a third TSV 470c are disposed outside the first chip selection pad 412 and the second chip selection pad 414 respectively in each of the chips 410a to 410d.

Each of the stacked chips 410a to 410d are formed with rewirings 480 for interconnecting the first and second chip selection pads (CS1) 412 and (CS2) 414 and the TSVs 470a, 470,b and 470c. The rewirings 480 are formed so that only two of the three TSVs 470a, 470b, and 470c are connected to the first and second pads 412 and 414, and particularly formed so that the connection structures to the first and second pads 412 and 414 of one chip are different from at least the adjacently stacked chip(s) or all the other stacked chips 410a to 410d.

For example, a first chip 410a which is disposed at the lowermost is formed so that its rewirings 480 connect the first TSV 470a to the first and second pad 412 and 414. A second chip 410b, which is disposed over the first chip 410a, is formed so that its rewirings 480 connect the first TSV 470a to the first pad 412 and the third TSV 470c to the second pad 414. A third chip 410c, which is disposed over the second chip 410b, is formed so that its rewirings 480 connect the first TSV 470a to the second pad 414 and the second TSV 470b to the first pad 412. The fourth chip 410d, which is disposed at the uppermost, is formed so that its rewirings 480 connect the second TSV 470b to the first pad 412 and the third TSV 470c to the second pad 414.

In the TSV chip stack package 400 in accordance with an embodiment of the present invention, the first and second pads 412 and 414 in each of the chips 410a to 410d are connected to Vcc and Vss terminals of the substrate 420 through the first to third TSVs 470a to 470c and the rewirings 480 which are formed differently in each of the chips 410a to 410d, and a chip selection is made by different variations of Vcc and Vss signals applied to the chips through the Vcc and Vss terminals.

For example, as shown in FIG. 5, the first chip 410a is selected in the case when only the first TSV 470a is applied with the Vcc signal; the third chip 410c is selected in the case when the first TSV 470a and the second TSV 470b are applied with the Vcc signal and the Vss signal respectively; the second chip 410b is selected in the case when the first TSV 470a and the third TSV 470c are applied with the Vcc signal and the Vss signal respectively; and the fourth chip 410d is selected in the case that the second TSV 470b and the third TSV 470c are applied with the Vcc signal and the Vss signal respectively.

Figure 1:
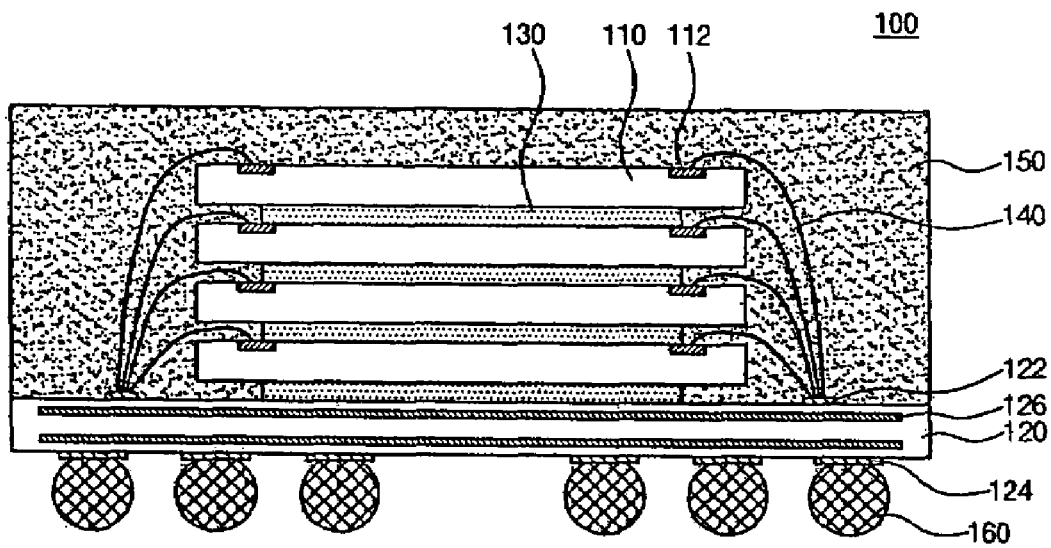
FIG. 1 is a cross-sectional view illustrating a conventional chip stack package.
Figure 2:
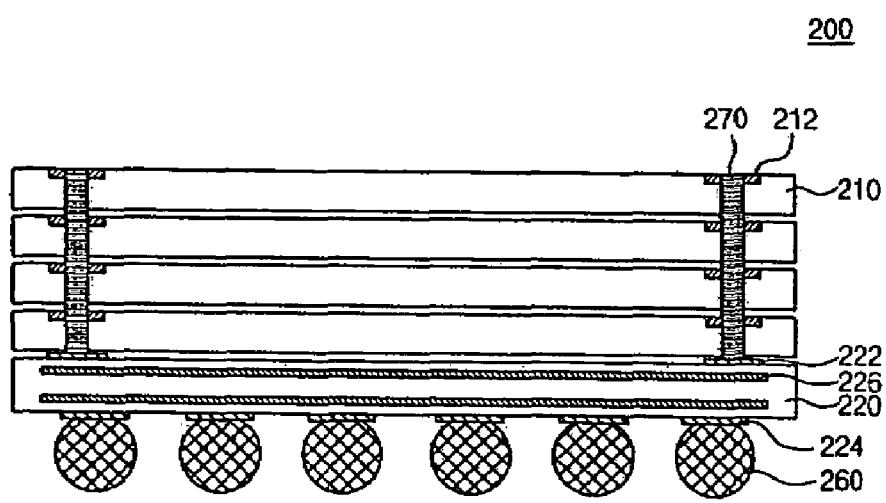
FIG. 2 is a cross-sectional view illustrating a through silicon via chip stack package.
Figure 3:
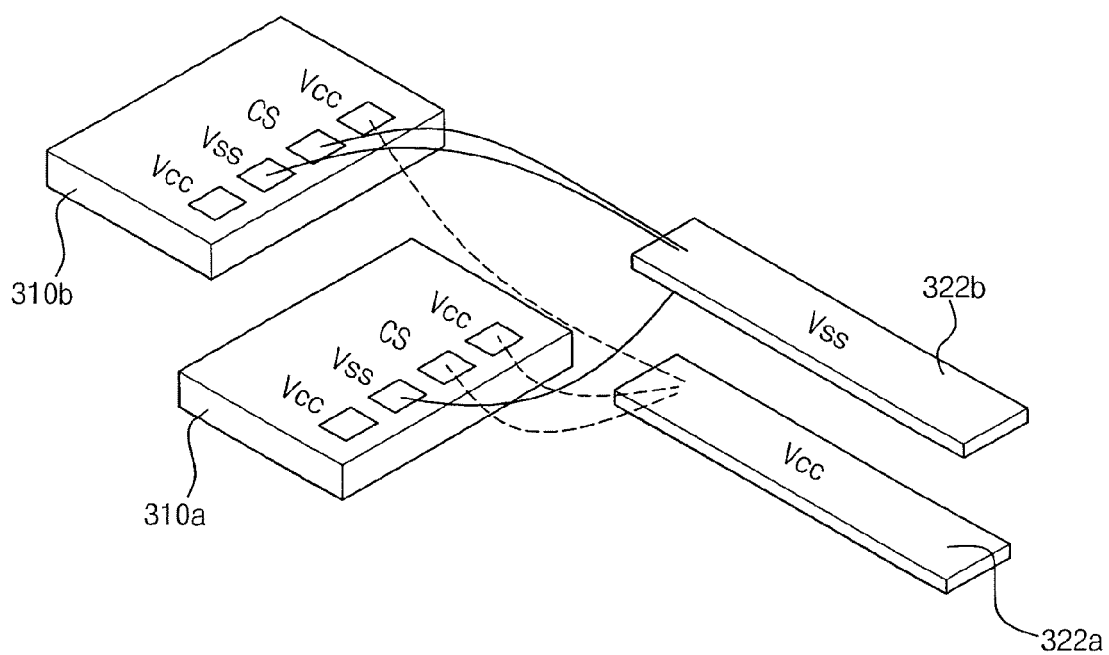
FIG. 3 is a view illustrating chip selection in the conventional chip stack package.

As described above, the TSV chip stack package as shown in FIGS. 4-5 can facilitate the chip selection during the device is operated by making the signal applied to the TSVs including the rewirings different in each of the stacked chips, in the manner similar to the selection being made in the conventional chips shown in FIGS. 1 and 3 that are stacked using wire bonding.

Therefore, the structure according to an embodiment of the present invention provides that the chips are stacked using the TSV while allowing the chip selection to be facilitated even during the device in operation.

Figure 6:
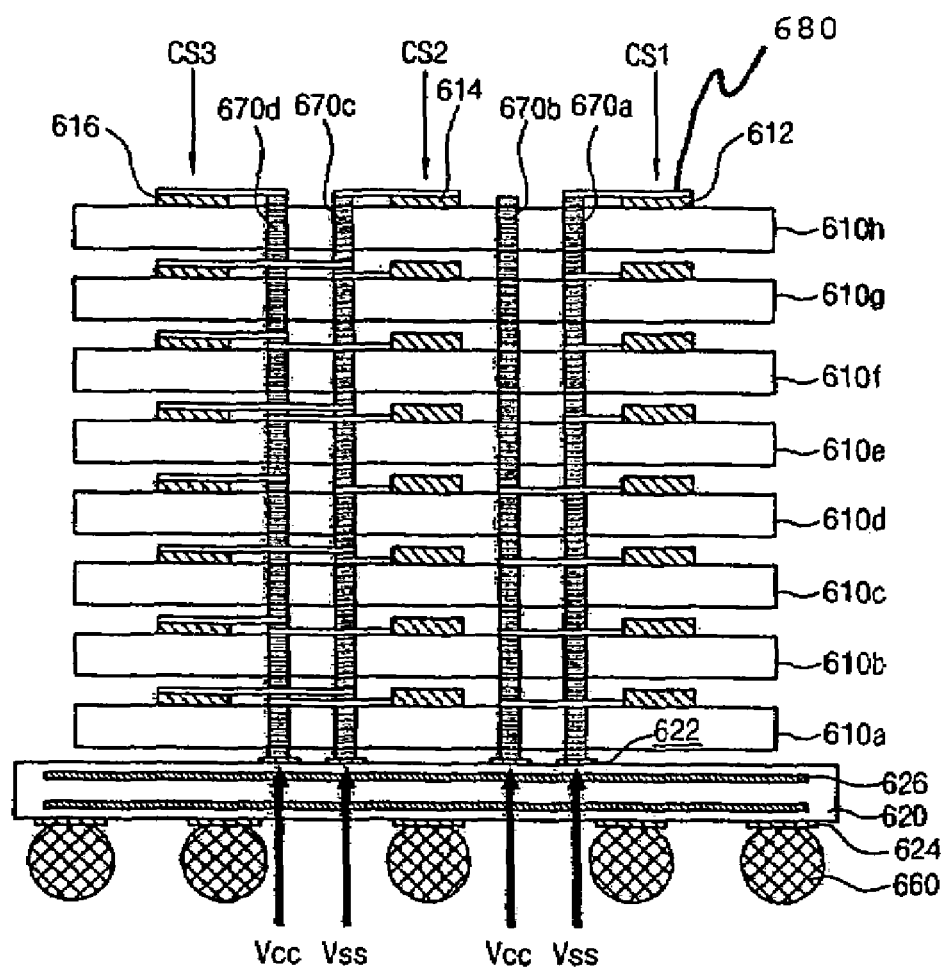
FIG. 6 is a cross-sectional view illustrating a through silicon via chip stack package in accordance with another embodiment of the present invention.

FIGS. 6 and 7 are cross-sections views illustrating a TSV chip stack package and a chip selection thereof in accordance with another embodiment of the present invention.

Referring to FIG. 6, the TSV chip stack package 600 in accordance with another embodiment of the present invention has a structure in which eight chips 610a to 610h are stacked over a substrate 620 provided with a circuit wiring 626 including electrode terminals 622 and ball lands 624, so that TSVs 670a to 670d provided to each of the chips 610a to 610h are in contact with one another, and solder balls 660 are attached to the ball lands 624 of a lower surface of the substrate 620 as an outside connection terminal.

Each of the stacked chips 610a to 610h is provided with a first chip selection pad (CS1) 612, a second chip selection pad (CS2) 614, and a third chip selection pad (CS3) 616. Also, each of the stacked chips 610a to 610h is provided with first and second TSVs 670a and 670b formed between the first and second pads 612 and 614, and third and fourth TSVs 670c and 670d formed between the second and third pads 614 and 616.

Further, each of the stacked chips 610a to 610h is provided with rewirings 680 for connecting the first to third pads 612, 614, and 616 and the first to fourth TSV 670a to 670d. The rewirings 680 are formed so as to connect the first to third pads 612, 614, and 616 and the first to fourth TSVs 670a to 670d with the connection structures that are different from one another in each of the stacked chips 610a to 610h.

For example, the rewiring 680 of the first chip 610a is formed so as to connect the second TSV 670b to the first pad 612, the fourth TSV 670d to the second pad 614, and the third TSV 670c to the third pad 616. The rewiring 680 of the second chip 610b is formed so as to connect the second TSV 670b to the first pad 612, the fourth TSV 670d to the second pad 614, and the fourth TSV 670d to the third pad 616. The rewiring 680 of the third chip 610c is formed so as to connect the second TSV 670b to the first pad 612, the third TSV 670c to the second pad 614, and the third TSV 670c to the third pad 616. The rewiring 680 of the fourth chip 610d is formed so as to connect the second TSV 670b to the first pad 612, the third TSV 670c to the second pad 614, and the fourth TSV 670d to the third pad 616.

The rewiring 680 of the fifth chip 610e is formed so as to connect the first TSV 670a to the first pad 612, the fourth TSV 670d to the second pad 614, and the third TSV 670c to the third pad 616. The rewiring 680 of the sixth chip 610f is formed so as to connect the first TSV 670a to the first pad 612, the fourth TSV 670d to the second pad 614, and the fourth TSV 670d to the third pad 616. The rewiring 680 of the seventh chip 610g is formed so as to connect the first TSV 670a to the first pad 612, the third TSV 670c to the second pad 614, and the third TSV 670c to the third pad 616. Finally, the rewiring 680 of the eighth chip 610h is formed so as to connect the first TSV 670a to the first pad 612, the third TSV 670c to the second pad 614, and the fourth TSV 670d to the third pad 616.

In the TSV chip stack package 600 in accordance with another embodiment of the present invention, the first to third pads 612, 614, and 616 in each of the chips 610a to 610h are connected to Vcc and Vss terminals of the substrate 620 through the first to fourth TSVs 670a to 670d and the rewirings 680 which are formed differently in each of the chips 610a to 610h. The chip selection is made by applying different variations of Vcc and Vss signals through the Vcc and Vss terminals.

For example, as shown in FIG. 7, the first chip 610a is selected in the case when the first pad 612 is applied with the Vcc signal, the second pad 614 is applied with the Vcc signal and the third pad 616 is applied with the Vss signal; the second chip 610b is selected in the case when the first pad 612 is applied with the Vcc signal, the second pad 614 is applied with the Vcc signal and the third pad 616 is also applied with the Vcc signal; the third chip 610c is selected in the case when the first pad 612 is applied with the Vcc signal, the second pad 614 is applied with the Vss signal, and the third pad 616 is also applied with the Vss signal; and the fourth chip 610d is selected in the case when the first pad 612 is applied with the Vcc signal, the second pad 614 is applied with the Vss signal, and the third pad 616 is applied with the Vcc signal.

In addition, the fifth chip 610e is selected in the case when the first pad 612 is applied with the Vss signal, the second pad 614 is applied with the Vcc signal, and the third pad 616 is applied with the Vss signal; the sixth chip 610f is selected in the case when the first pad 612 is applied with the Vss signal, the second pad 614 is applied with the Vcc signal, and the third pad 616 is also applied with the Vcc signal; the seventh chip 610g is selected in the case when the first pad 612 is applied with the Vss signal, the second pad 614 is applied with the Vss signal, and the third pad 616 is also applied with the Vss signal; and the eight chip 610h is selected in the case when the first pad 612 is applied with the Vss signal, the second pad 614 is applied with the Vss signal, and the third pad 616 is applied with the Vcc signal.

The TSV chip stack package as shown in FIGS. 6-7 can also facilitate the chip selection during the device in operation by making the signal applied to the TSVs including the rewirings different in each of the stacked chips. Particularly, since the TSV chip stack package as shown in FIGS. 6-7 (as wells that shown in FIGS. 4-5) is constructed not by increasing number of the chip selection pads but by disposing two TSVs between the chip selection pads and making the connection structure using the rewirings different in each of the chips, it is not necessary to increase the number of the chip selection pads, and thus it is possible to prevent the chip size from increasing.

As is apparent from the above description, according to an embodiment of the present invention, since the rewirings for connecting the chip selection pads and the TSVs are formed differently in each of the stacked chips, it is possible to realize a TSV chip stack package which facilitates a chip selection during a device is operated. Therefore, by employing a TSV chip stack package structure in accordance with an embodiment of the present invention, chip selection can be facilitated during the operation as well the size and height of a package are relatively reduced while the operational speed is relatively enhanced, thus it is possible to realize a high performance product.

Also, because the chip selection is made by making the connection structures between the TSV and the chip selection pads different from one another, it is not necessary to increase number of the chip selection pads, the increase of the chip size due to the increased number of chip selection pads can be prevented in accordance with an embodiment of the present invention.

Although a specific embodiments of the present invention has been described for illustrative purposes, those skilled in the art will appreciate that various modifications, additions and substitutions are possible, without departing from the scope and the spirit of the invention as disclosed in the accompanying claims.

What is claimed is:

1. A through silicon via chip stack package, comprising:
a substrate;
a plurality of chips stacked over the substrate, each chip having chip selection pads that are formed on each of the chips, through silicon vias that is spaced apart from each of the chip selection pads, and rewirings directly electrically connecting one of the chip selection pad and the through silicon via, wherein the through silicon vias of each chip is correspondingly connected to the through silicon vias of the adjacently stacked chip; and
outside connection terminals attached to a lower surface of the substrate,
wherein the rewirings in each of stacked chips are formed so as to have connect between the chip selection pads and the through silicon vias such that the pattern for connecting the chip selection pattern and the through silicon vias is different for each stacked chip.

2. The through silicon via chip stack package according to claim 1, wherein the total number of the chips stacked over the substrate is $2^n$ where n is an integer equal to or greater than two.

3. The through silicon via chip stack package according to claim 2, wherein the total number of the chips stacked over the substrate is four.

4. The through silicon via chip stack package according to claim 3, wherein each of the stacked chips is provided with first and second chip selection pads, first to third through silicon vias, and two rewirings, such that the connection between the first and second chip selection pads and the first to third through silicon vias is different for each chip.

5. The through silicon via chip stack package according to claim 4, wherein first through silicon via is disposed between the first and the second chip selection chips, and the second and the third through silicon vias are disposed outside the first and the second chip selection chips respectively.

6. The through silicon via chip stack package according to claim 1, wherein the first to third through silicon vias are applied with Vss or Vcc signal.

7. The through silicon via chip stack package according to claim 2, wherein the total number of the chips stacked over the substrate is eight.

8. The through silicon via chip stack package according to claim 7, wherein each of the stacked chips is provided with first to third chip selection pads, first to fourth through silicon vias, and three rewirings, such that the connection between the first to third chip selection pads and the first to fourth through silicon vias is different for each chip.

9. The through silicon via chip stack package according to claim 8, wherein the first and second through silicon vias are disposed between the first and the second chip selection chips, and the third and fourth through silicon vias are disposed between the second and the third chip selection chips.

10. The through silicon via chip stack package according to claim 9, wherein the first to fourth through silicon vias are applied with Vss or Vcc signal.

11. The through silicon via chip stack package according to claim 1, wherein the outside connection terminal is a solder ball.

* * * * *